United States Patent [19]
Mizukoshi

[11] Patent Number: 5,521,435
[45] Date of Patent: May 28, 1996

[54] SEMICONDUCTOR DEVICE AND A FABRICATION PROCESS THEREOF

[75] Inventor: Masataka Mizukoshi, Kawasaki, Japan

[73] Assignee: Fujitsu Limited, Kawasaki, Japan

[21] Appl. No.: 301,403

[22] Filed: Sep. 8, 1994

[30]    Foreign Application Priority Data

Dec. 13, 1993  [JP]  Japan .................................. 5-312302

[51] Int. Cl.$^6$ ..................................................... H01L 23/04
[52] U.S. Cl. .......................... 257/698; 257/706; 257/780; 257/738
[58] Field of Search ..................... 257/700, 698, 257/706, 723, 668, 691, 730, 737, 738, 780

[56]    References Cited

U.S. PATENT DOCUMENTS

| | | | |
|---|---|---|---|
| 4,721,995 | 1/1988 | Tanizawa | 257/668 |
| 4,901,136 | 2/1990 | Neugebauer et al. | 257/668 |
| 5,309,021 | 5/1994 | Shimamoto et al. | 257/698 |
| 5,357,400 | 10/1994 | Takekawa | 257/668 |

FOREIGN PATENT DOCUMENTS 63-124449  5/1988  Japan .

Primary Examiner—Sara W. Crane
Assistant Examiner—S. V. Clark
Attorney, Agent, or Firm—Armstrong, Westerman, Hattori, McLeland & Naughton

[57]    ABSTRACT

A semiconductor device includes a package substrate and a semiconductor chip provided on the package substrate, wherein there is provided a jumper substrate carrying thereon electrodes and conductor patterns that connect the electrodes, such that the jumper substrate is mounted upon the package substrate for providing an interconnection between the electrode patterns provided on the upper major surface of the package substrate in electrical connection with the electrode pads on the semiconductor chip and the electrodes that are isolated in correspondence to the through-holes provided on the package substrate.

12 Claims, 14 Drawing Sheets

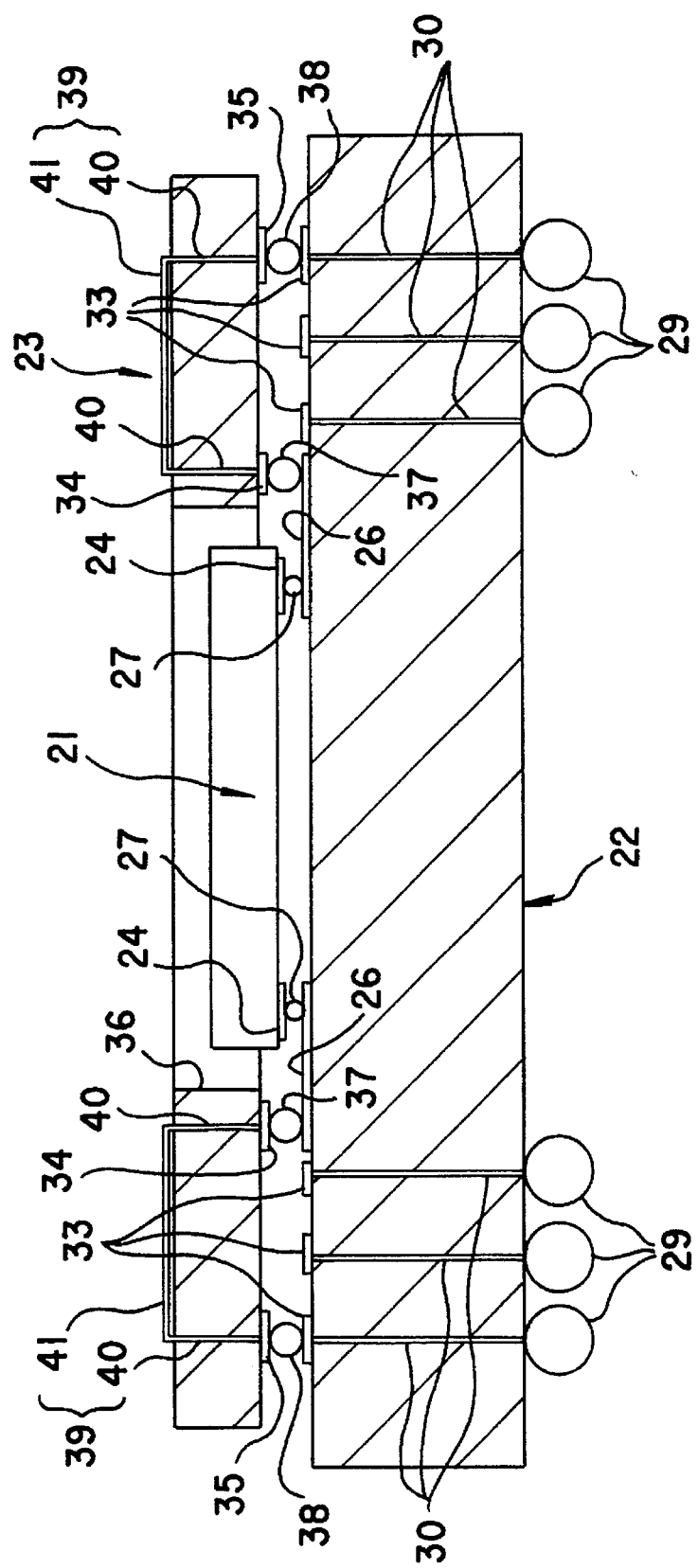

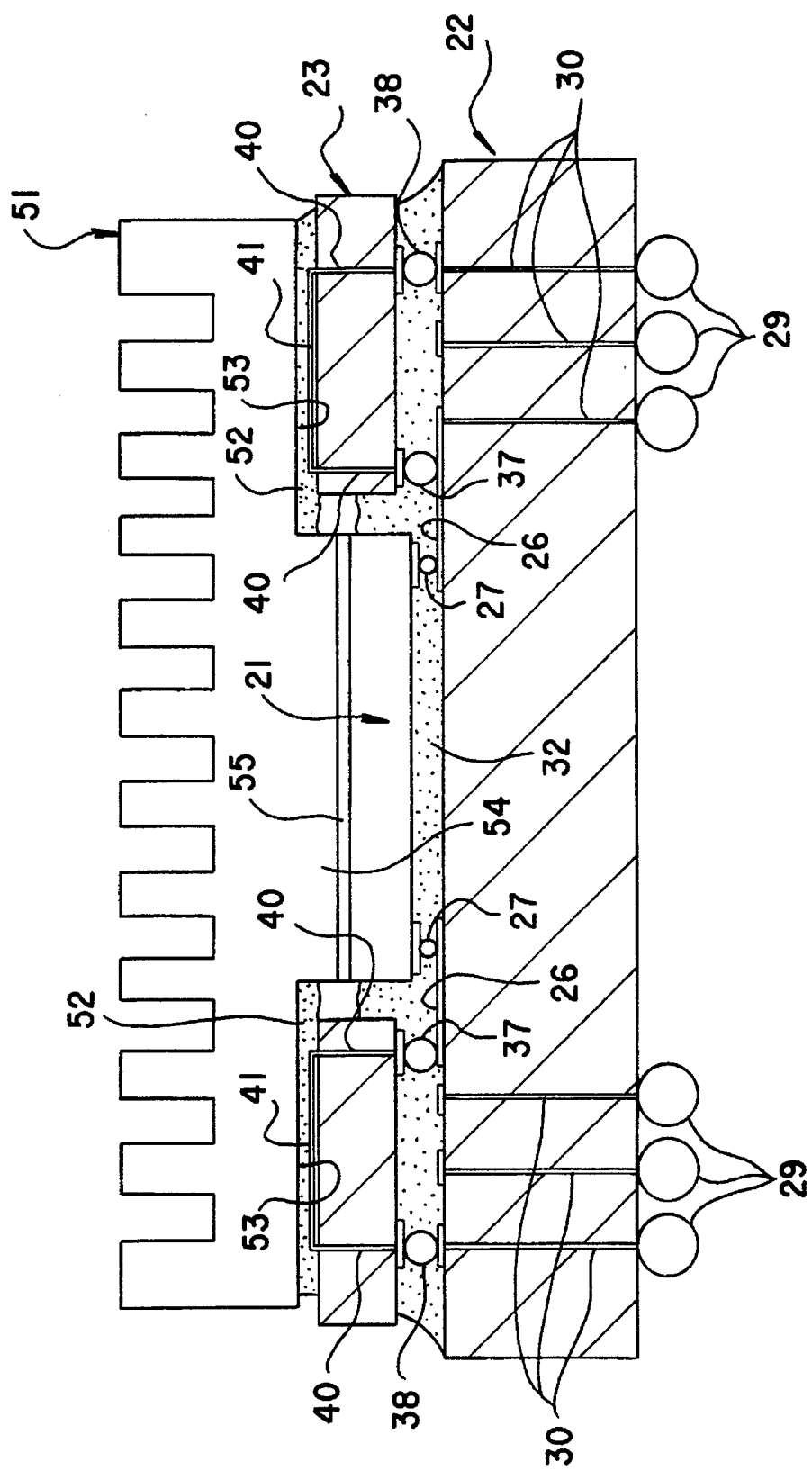

SEMICONDUCTOR DEVICE AND A FABRICATION PROCESS THEREOF

BACKGROUND OF THE INVENTION

The present invention generally relates to semiconductor devices and more particularly to a semiconductor device having a package substrate provided with through-holes as well as a fabrication process thereof.

There is a known construction of semiconductor device having a resin package body in which a semiconductor chip is held on a multilayer package substrate in the form of bare chip. In such a semiconductor device, the package substrate, typically formed of glass epoxy, carries electrodes on an upper major surface thereof for electrical contact with the semiconductor chip. Further, there are provided electrodes on a lower major surface of the package substrate for electrical contact with external circuits such as a printed circuit board. Thereby, the electrodes on the upper major surface of the package substrate are electrically connected to corresponding electrodes on the lower major surface of the package substrate by way of through-holes that penetrate through the package substrate from the upper major surface to the lower major surface.

With increasing integration density of the semiconductor integrated circuits, there is a tendency that the number of the electrode pads on a semiconductor chip increases. As the foregoing electrodes on the upper as well as lower major surfaces of the package substrate are provided in correspondence to the electrode pads on the semiconductor chip, the number of the electrodes as well as the number of the through-holes on the package substrate increase with increasing number of the electrode pads on the semiconductor chip. Thus, there arises a contradiction between the requirement to increase the number of the electrode pads on the semiconductor chip as much as possible in correspondence to the increased integration density and the requirement to reduce the package size as much as possible.

FIGS.1–3 show a conventional semiconductor device 1 wherein FIG.1 shows a part of the semiconductor device 1 in an elevational cross sectional view in an enlarged scale.

Referring to FIG. 1, it will be noted that the semiconductor device is primarily formed of a semiconductor chip 2 and a package substrate 3 that supports the semiconductor chip 2 thereon. The package substrate 3 has a three-layered structure including layer elements $3_{-1}$–$3_{-3}$ for realizing increased density of electrodes. More specifically, the layer element $3_{-3}$ at the lowermost level physically supports the semiconductor chip 2. Typically, the semiconductor chip 2 is mounted upon the layer element $3_{-3}$ by means of adhesive.

The layer element $3_{-2}$ is provided upon the layer element $3_{-3}$ and includes an opening 4 for accommodating the semiconductor chip 2. Further, the layer element $3_{-1}$ on the layer element $3_{-2}$ includes another opening 5 in correspondence to the opening 4 for accommodating the semiconductor chip 2, wherein the opening 5 has an area larger than the area of the opening 4, and there is provided a step between the layer element $3_{-2}$ and the layer element $3_{-1}$.

It should be noted that the package substrate 3 is formed of a number of through-holes penetrating from the upper major surface of the layer element $3_{-1}$ to the lower major surface of the layer element $3_{-3}$, and a conductive member such as a copper plug or sleeve fills the through-holes 9. Thereby, the through-holes 9 provide an electrical path for connecting the electrodes on the upper major surface and the electrodes on the lower major surface of the package substrate 3.

As indicated in FIGS. 2 and 3, there are provided electrodes 7 on the upper major surface of the layer element $3_{-2}$ along the peripheral edge of the opening 4 for connection with electrode pads 6 on the semiconductor chip 2. Similarly, there are provided electrodes 8 on the upper major surface of the layer element $3_{-1}$ along the peripheral edge of the opening 5 for connection with other electrode pads 6 on the semiconductor chip 2. The contact electrodes 7 and 8 are thereby connected to the corresponding electrode pads 6 on the semiconductor chip 2 by way of bonding wires 9a and 10.

Further, the electrodes 7 on the layer element $3_{-2}$ and the electrodes 8 on the layer element $3_{-8}$ are connected to respective, corresponding through-holes 9 shown in FIGS. 2 and 3 by solid circles, by way of conductor patterns $10_{-1}$ and $10_{-2}$ that are provided respectively on the layer elements $3_{-1}$ and $3_{-2}$. In other words, the conventional semiconductor device of FIGS.1–3 achieves the mounting of high integration density semiconductor chip on a small package body by constructing the package substrate 3 from the layer elements $3_{-1}$–$3_{-3}$ and by forming the conductor patterns $10_{-1}$ and $10_{-2}$ respectively on the layer elements $3_{-1}$ and $3_{-2}$.

In the conventional semiconductor device 1 of FIGS.1–3, it is necessary to form the conductor patterns $10_{-1}$ and $10_{-2}$ such that the conductor patterns $10_{-1}$ and $10_{-2}$ avoid the through-holes 9 that penetrate through the package substrate 3. Thus, while it is necessary in the semiconductor devices having a high integration density to provide a large number of through-holes 9, such an increase in the number and hence the density of the through-holes 9 inevitably invites an increased area of the package substrate 3 that is occupied by the through holes 9. Thereby, there arises a difficulty in providing the necessary conductor patterns $10_{-1}$ and $10_{-2}$ on the respective layer elements. Further, the degree of freedom for providing the conductor patterns $10_{-1}$ and $10_{-2}$ is substantially reduced and there arises a case in which the connection of an electrode pad on the semiconductor chip 2 to a corresponding through-hole becomes difficult. In order to avoid the foregoing problem, it is necessary to increase the area of the layer elements $3_{-1}$–$3_{-3}$ and hence the size of the package substrate 3, while such an increase in the size of the package substrate 3 contradicts with the requirement to reduce the size of the package body of the semiconductor device.

Associated with the foregoing problem, there further arises a difficulty in the conventional semiconductor device in that two of the conductor patterns $10_{-1}$ or $10_{-2}$ come excessively close with each other in the vicinity of the through holes 9 and cause an electrical interference or crosstalk. When such an interference occurs, the risk of malfunctioning of the semiconductor device increases substantially.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a reliable and compact semiconductor device and a fabrication process thereof wherein a large degree of freedom of wiring is secured when designing the package body, while simultaneously minimizing the size of the package body of the semiconductor device.

Another object of the present invention is to provide a semiconductor device, comprising:

a semiconductor chip carrying thereon electrode pads;

a package substrate having upper and lower major surfaces for supporting said semiconductor chip on said upper major surface;

first group electrodes provided on said upper major surface of said package substrate in a first area in electrical connection to said electrode pads on said semiconductor chip;

second group electrodes provided on said upper major surface of said package substrate in a second area different from said first area;

third group electrodes provided on said lower major surface of said package substrate for external connection;

through-holes provided on said package substrate so as to extend therethrough from said upper major surface to said lower major surface of said package substrate, each of said through-holes connecting one of said second group electrodes to a corresponding one of said third group electrodes and including a conductive member for connecting said first group electrode to said second group electrode electrically;

a jumper substrate having upper and lower major surfaces and disposed on said upper major surface of said package substrate such that said lower major surface of said jumper substrate faces said upper major surface of said package substrate, said jumper substrate carrying first contacts on said lower major surface in electrical connection with said first group electrodes on said upper major surface of said package substrate, second contacts also on said lower major surface in electrical connection with said second group electrodes on said upper major surface of said package substrate, and an interconnection pattern connecting each of said first contacts on said jumper substrate to corresponding one of said second contacts on said jumper substrate;

said jumper substrate having an opening extending from said upper major surface to said lower major surface of said jumper substrate for accommodating said semiconductor chip therein; and a resin body provided on said upper major surface of said package substrate for encapsulating said semiconductor chip together with said jumper substrate on said upper major surface of said package substrate.

According to the present invention, the interconnection between the electrode pads on the semiconductor chip and the through-holes on the package substrate is achieved not only by the conductor patterns on the package substrate but also by way of the interconnection pattern provided on the jumper substrate. As a result, the degree of freedom for designing the conductor patterns on the package substrate increases substantially without increasing the size of the package substrate. Further, the problem of electromagnetic interference or crosstalk between the conductor patterns on the package substrate is successfully eliminated.

Further, it should be noted that the jumper substrate, provided on the upper major surface of the package substrate so as to laterally surround the semiconductor chip, does not increase the size of the semiconductor device. In other words, the semiconductor device of the present invention has a compact size even when a semiconductor chip having a large integration density is employed. As the jumper substrate is provided on the package substrate, one can form the interconnection pattern on the jumper substrate to extend across the conductor patterns on the package substrate, and the degree of freedom of wiring increases substantially. Further, the use of the jumper substrate above the package substrate enhances the rigidity of the semiconductor device.

In a preferred embodiment of the present invention, said jumper substrate carries a heat sink member on said upper major surface thereof, for radiating heat generated in said semiconductor chip. By providing the heat sink member as such, it is possible to improve the efficiency of heat dissipation of the semiconductor device. As the heat sink structure is not mounted upon the semiconductor chip itself, the thermal stress applied to the semiconductor chip is minimized.

In a more preferred embodiment of the present invention, a thermally conductive resin is interposed between said semiconductor chip and said heat sink member. By interposing the thermally conductive resin between said semiconductor chip and said jumper substrate as such, any thermal stress induced as a result of difference in the thermal expansion coefficient between the semiconductor chip and the heat sink member, is successfully absorbed, and the problem of damaging the semiconductor chip is eliminated. As the resin interposed between the semiconductor chip and the heat sink member has an excellent thermal conductivity, the dissipation of heat from the semiconductor chip is achieved efficiently.

In another preferred embodiment of the present invention, said semiconductor chip is mounted upon said package substrate in a state that each of said electrode pads on said semiconductor chip establishes a contact engagement with corresponding one of said first group electrodes. By constructing the semiconductor device as such, it is possible to fabricate the semiconductor device according to the well-established flip-chip process.

In another preferred embodiment of the present invention, each of said electrode pads on said semiconductor chip is connected to corresponding one of said first group electrodes by a bonding wire. By constructing the semiconductor device as such, it is possible to fabricate the semiconductor device according to the well-established wire bonding process.

In another preferred embodiment of the present invention, said jumper substrate comprises a multiple layer printed circuit board that includes a plurality of substrate layers and corresponding plurality of conductor patterns. By employing such a multiple layer printed circuit board, the degree of freedom of wiring between the electrode pads on the semiconductor chip and the corresponding through-holes in the package substrate increases substantially.

Another object of the present invention is to provide a process for fabricating a semiconductor device, comprising the steps of:

mounting a semiconductor chip on a package substrate that carries first group electrodes and second group electrodes on an upper major surface thereof and third group electrodes on a lower major surface thereof, said package substrate further having through-holes in correspondence to said second and third group electrodes such that each of said through-holes extends from said upper major surface to said lower major surface between one of said second group electrodes and corresponding one of said third group electrodes, said step of mounting being conducted such that electrode pads on said semiconductor chip establish an electrical connection with said first group electrodes on said package substrate; and mounting a jumper substrate on said package substrate, said jumper substrate carrying thereon first contacts, second contacts, and an interconnection pattern extending between said first contacts and said second contacts, such that each of said first contacts establishes a contact engagement with corresponding one of said first group electrodes and such that each of said second contacts establishes a contact engagement with corresponding one of said second group electrodes.

According to the present invention, it is possible to construct a semiconductor device in which the degree of freedom for providing electrical connection between the semiconductor chip and the package substrate is increased substantially. In the semiconductor device thus fabricated, it is possible to minimize interference or crosstalk of signals on the conductor patterns on the package substrate by reducing the number of the conductor patterns on the package substrate. Further, the semiconductor device thus constructed is compact while using at the same time a high performance semiconductor chip having a large integration density and hence a large number of electrode pads. As the mounting of the semiconductor chip on the package substrate is achieved by a well established process such as flip-chip process or wire bonding process, there is no difficulty in the fabrication of the semiconductor device of the present invention.

In a preferred embodiment of the present invention, said step of mounting the semiconductor chip is conducted by way of flip-chip process.

In a preferred embodiment of the present invention, said step of mounting the semiconductor chip is conducted by way of wire bonding process.

In a preferred embodiment of the present invention, said step of mounting said semiconductor chip and said step of mounting said jumper substrate are conducted substantially simultaneously by conducting a reflowing process.

In a preferred embodiment of the present invention, said jumper substrate carries an opening having a size and shape corresponding to a size and shape of said semiconductor chip, and wherein said step of mounting said jumper substrate is conducted such that said opening of said jumper substrate defines, on said package substrate, an area on which said semiconductor chip is supported, said method further comprises a step of filling, after said step of mounting said semiconductor chip and said step of mounting said jumper substrate, said space by a resin. According to the present invention, the opening functions also as a resin dam that prevents the flow of the resin outside the opening. Thereby, it is possible to conduct the encapsulation of the semiconductor chip without forming a resin dam separately.

In a preferred embodiment of the present invention, said method further comprises a step of providing a heat sink structure upon said jumper substrate such that said heat sink structure is supported upon said jumper substrate, said step of providing the heat sink structure being conducted after said step of mounting said semiconductor chip and said step of mounting said jumper substrate.

In a more preferred embodiment of the present invention, said step of providing the heat sink structure is conducted after a step of filling said opening by a resin such that said semiconductor chip is embedded in said resin, such that said heat sink structure establishes an intimate contact with said resin in said opening.

Other objects and further features of the present invention will become apparent from the following detailed description when read in conjunction with the attached drawings.

BRIEF DESCRIPTION OF THE DRAWINGS

FIGS.11A–11D are diagrams showing the process for fabricating the semiconductor device of FIG.10.

DETAILED DESCRIPTION OF PREFERRED EMBODIMENTS

Figure 1:
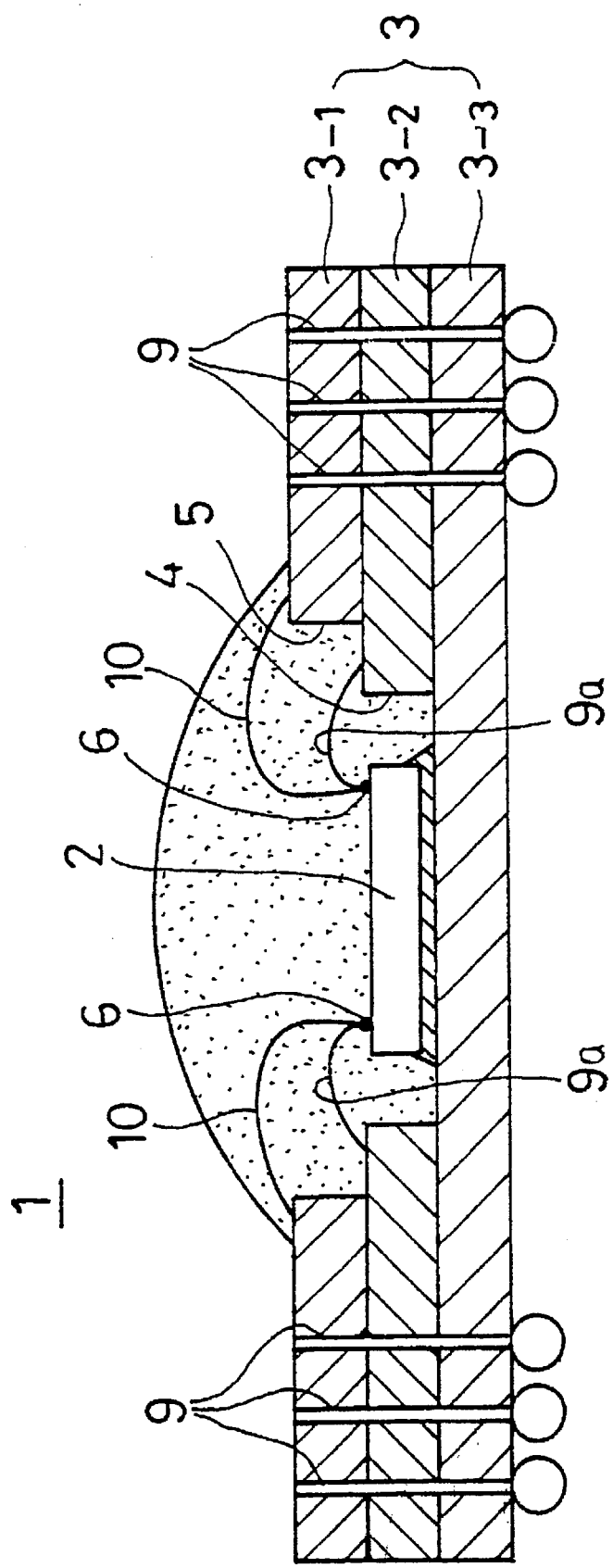
FIG.1 is a diagram showing the construction of a conventional semiconductor device constructed upon a package substrate in a cross sectional view.
Figure 2:
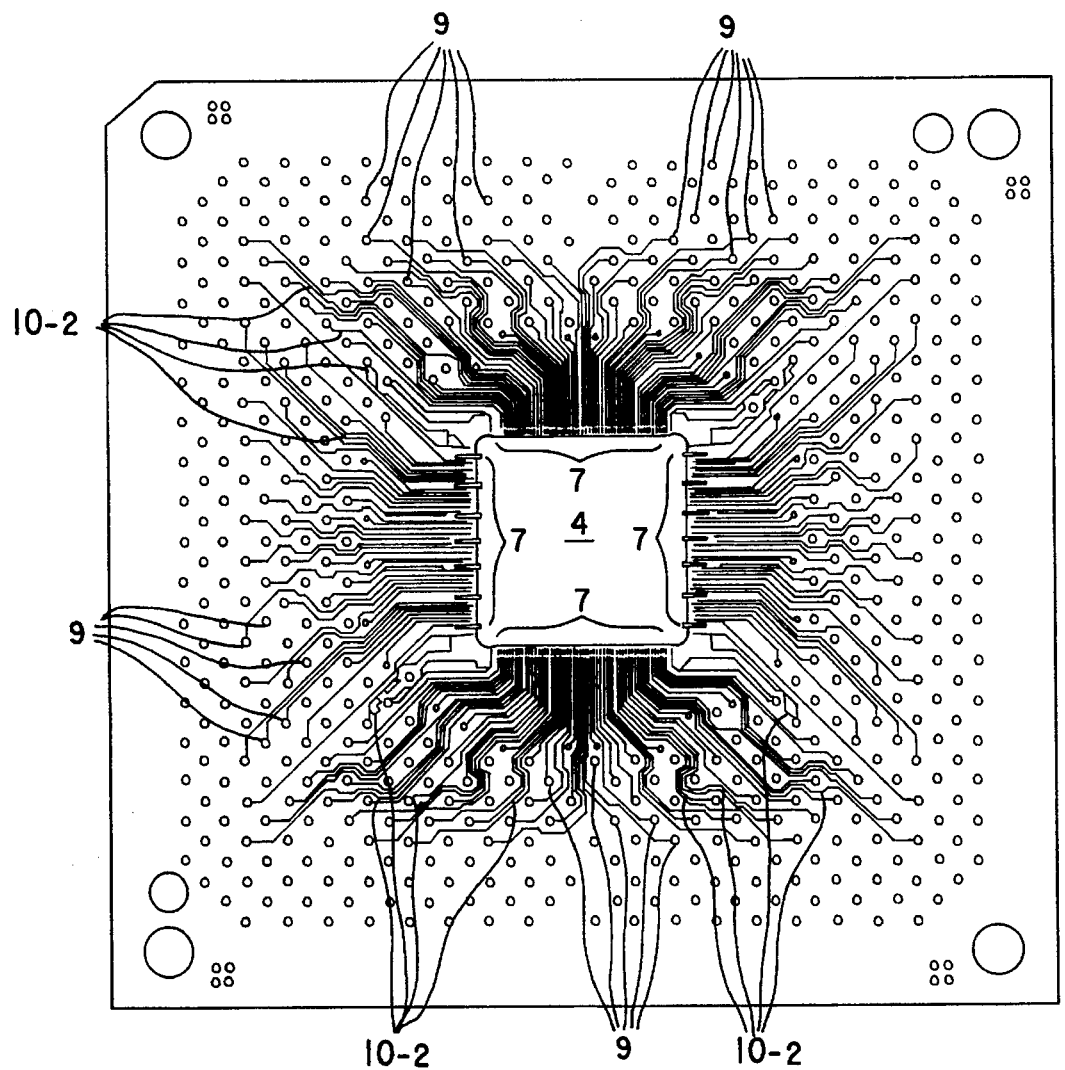
FIG.2 is a diagram showing a part of the semiconductor device of FIG.1 in a plan view.
Figure 3:
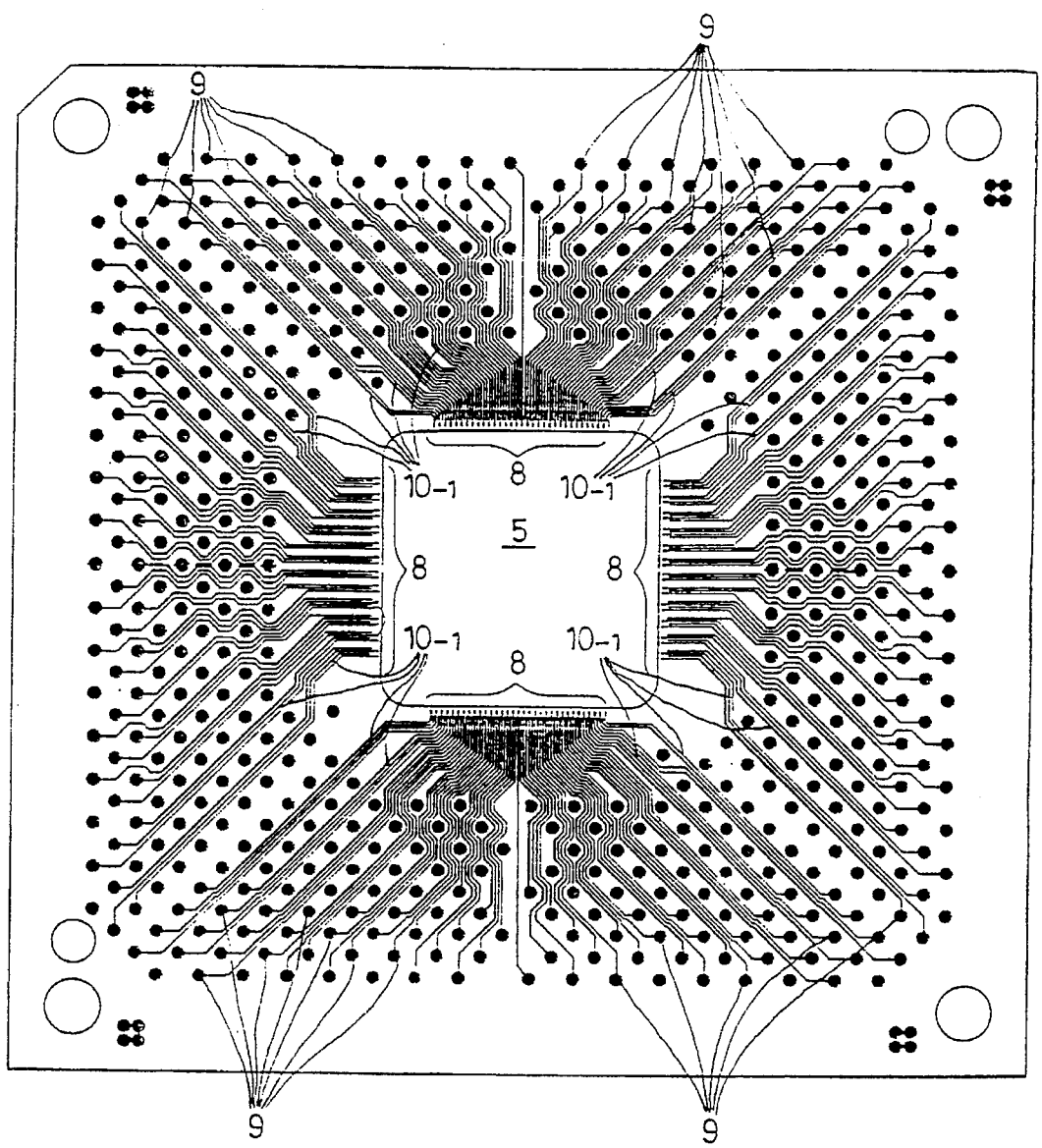
FIG.3 is a diagram showing another part of the semiconductor device of FIG.1 in a plan view.
Figure 4:
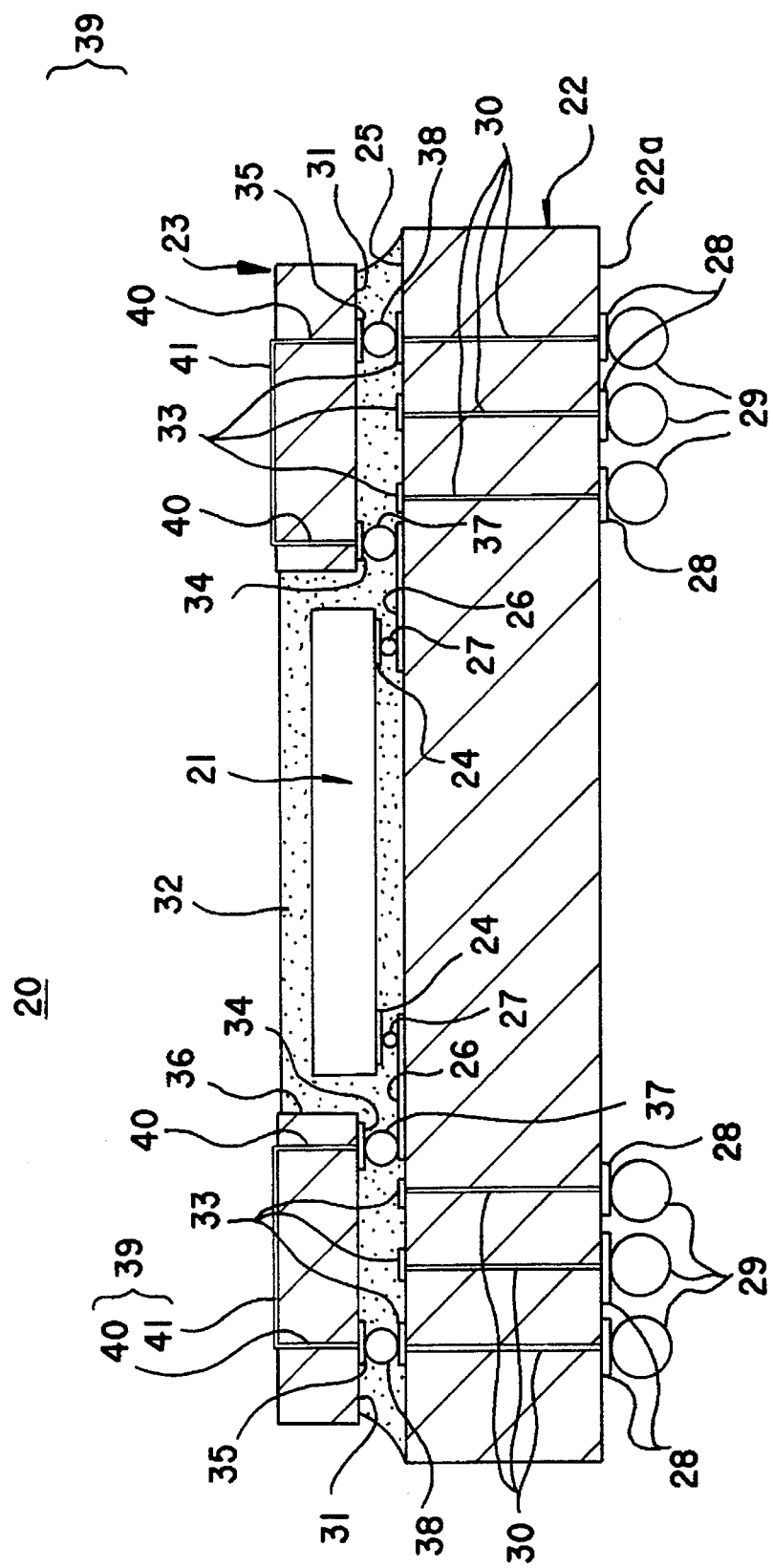
FIG.4 is a diagram showing a semiconductor device according to a first embodiment of the present invention in a cross sectional view.
Figure 5:
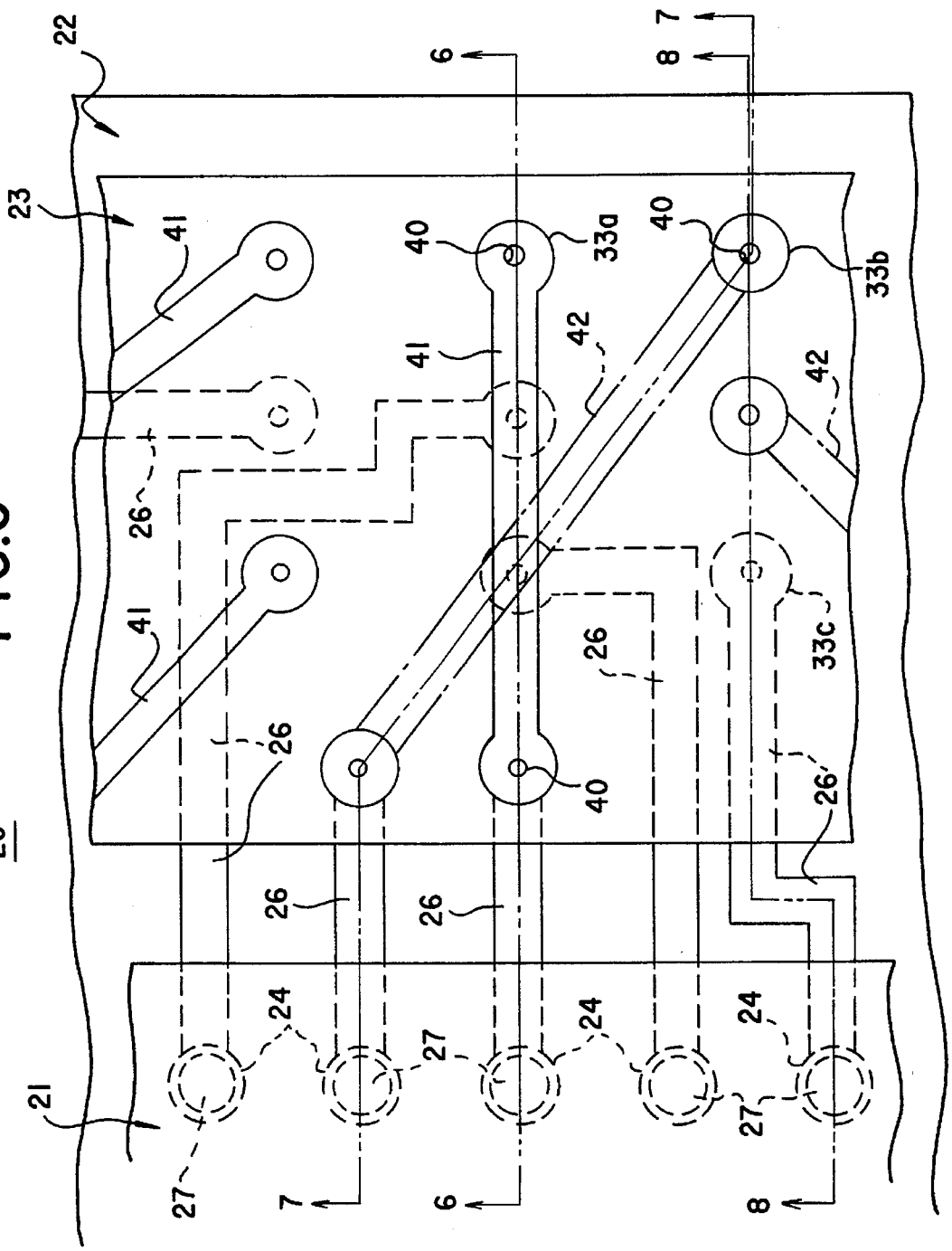
FIG.5 is a diagram showing a part of the semiconductor device of FIG.4 in a plan view.
Figure 6:
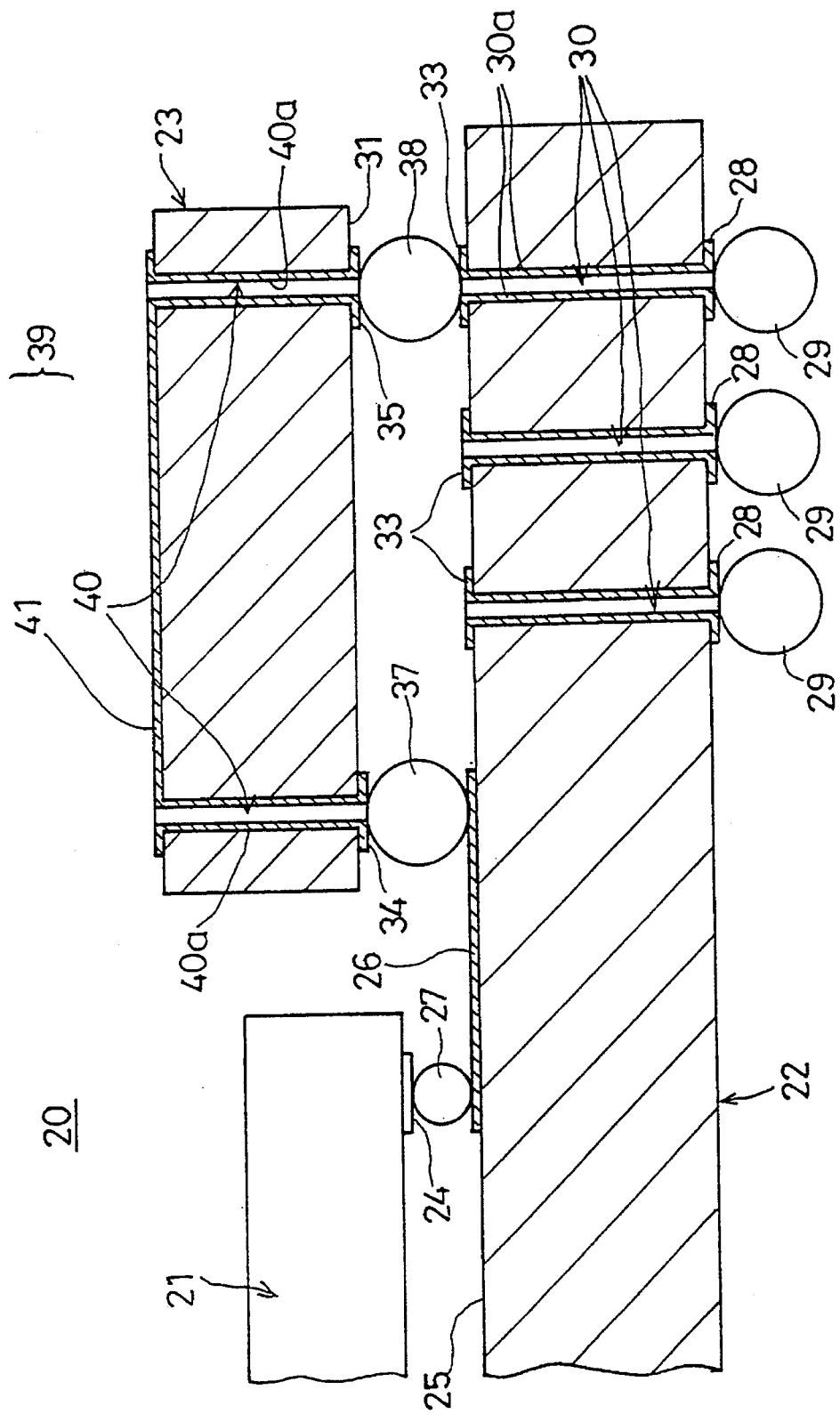
FIG.6 is a diagram showing the construction of the semiconductor device of FIG.4 along a first cross section.
Figure 7:
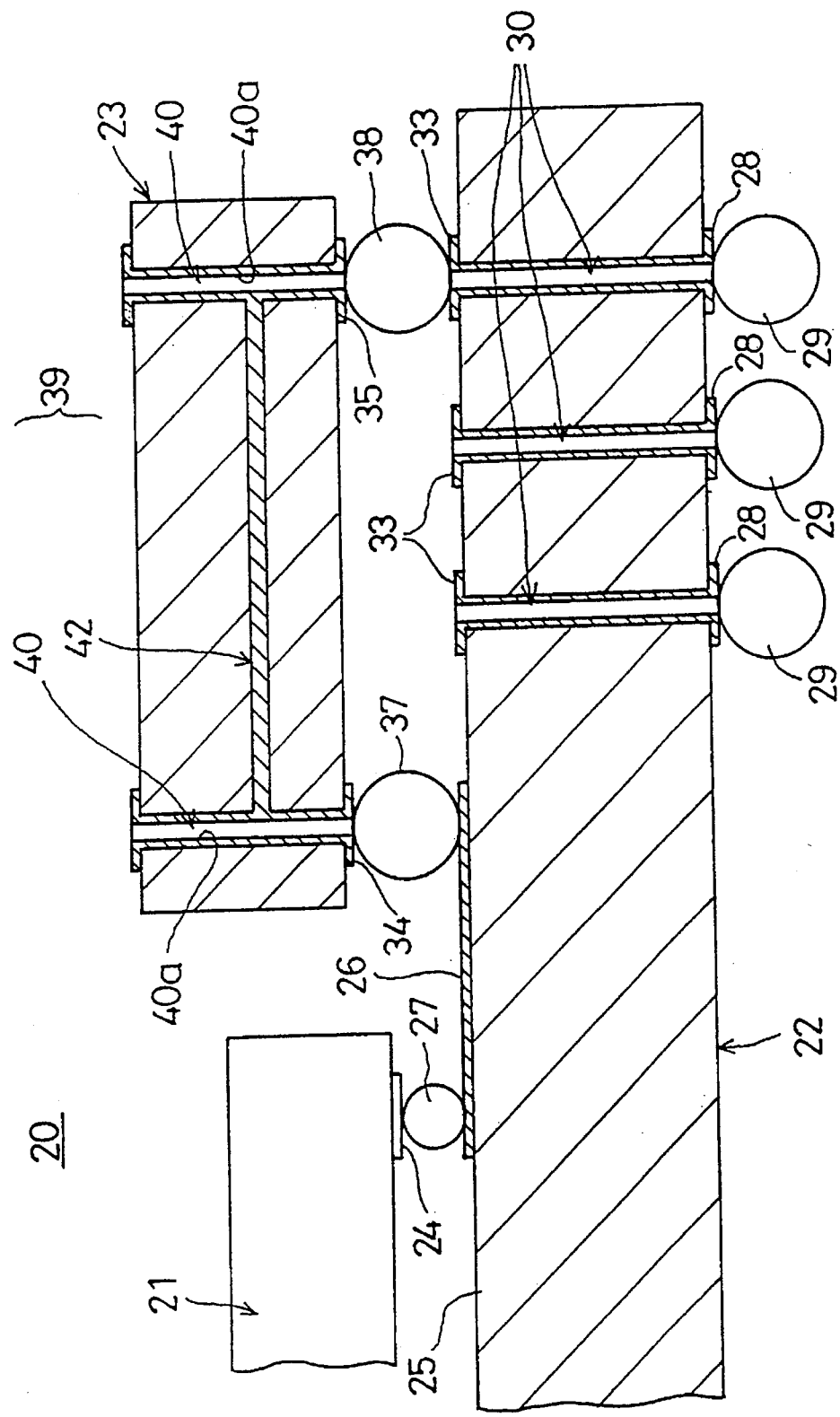
FIG.7 is a diagram showing the construction of the semiconductor device of FIG.4 along a second cross section.
Figure 8:
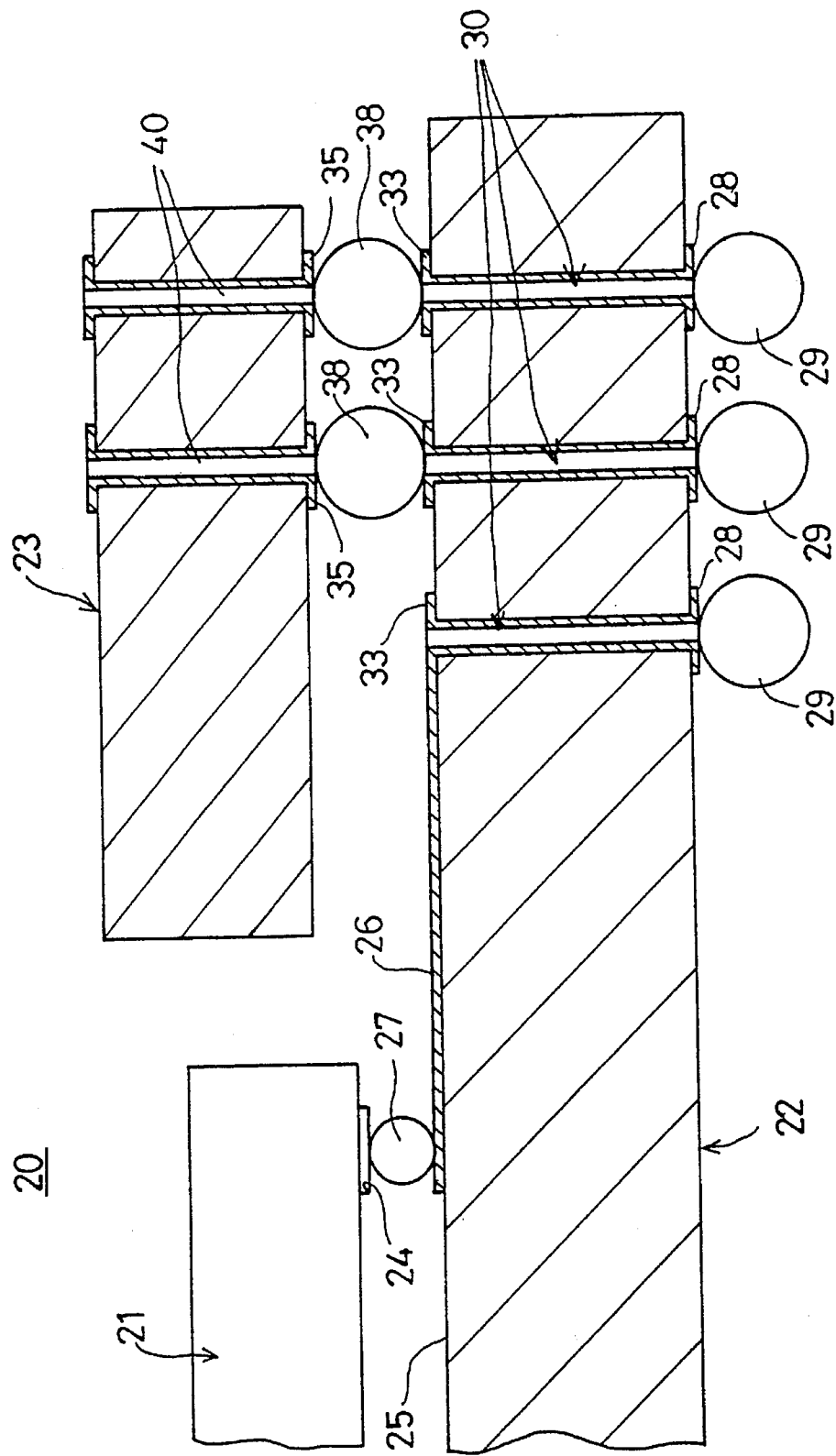
FIG.8 is a diagram showing the construction of the semiconductor device of FIG.4 along a third cross section.

FIGS.4–8 show a semiconductor device 20 according to a first embodiment of the present invention, wherein FIG.4 shows the overall structure of the semiconductor device 20 in an elevational cross sectional view while FIG.5 shows the same semiconductor device 20 in a plan view. Further, FIGS. 6–8 are enlarged cross sectional diagrams showing the semiconductor device 20 along the cross sections A—A, B—B and C—C defined in FIG.5.

Referring to FIG.4, the semiconductor device 20 is generally formed of a semiconductor chip 21, a package substrate 22 and a jumper substrate 23 to be described in detail below. The semiconductor chip 21 includes therein an integrated circuit having a large integration density and includes a number of electrode pads 24 on a lower major surface thereof. The semiconductor chip 21 is mounted upon the upper major surface of the package substrate 22 generally in correspondence to the central part thereof, wherein it will be noted that the electrode pads 24 on the lower major surface of the semiconductor chip 20 are connected to corresponding electrode patterns 26 provided on the upper major surface of the package substrate 22 by way of solder bumps 27.

The package substrate 22 is formed of a multiple-layer printed circuit board formed of stacking of a number of glass-epoxy substrates and has an upper major surface 25 on which the foregoing electrodes pattern 26 are formed. Further, the package substrate 22 has a lower major surface 22a that carries a number of electrodes 28 for external connection. In the illustrated example, each of the electrodes 28 carries a solder bump 29, while one may provide interconnection pins in correspondence to the electrodes 28.

The package substrate 22 is formed with a number of through-holes 30 each extending from the upper major surface 25 to the lower major surface 22a, and each of the through-holes 30 carries a conductive coating 30a such as a metal coating on the inner surface thereof as indicated in FIG. 7. It should be noted that each of the through-holes 30 has an upper electrode 33 on the upper major surface 25 of the package substrate 32 such that the electrode 33 is connected electrically to the conductive coating 30a in the through-hole 30, wherein the electrodes 33 are used for contact with the electrode pads 24 on the semiconductor chip 20. Further, the electrodes 28 on the lower major surface 22a of the package substrate are provided in correspondence to the through-holes 30, such that each of the electrodes 28 is connected electrically to the conductive coating 30a in the corresponding through-hole 30. Typically, the electrodes 26, 28 and 33 as well as the conductive coating 30a are formed of copper film that is shaped to a predetermined pattern after deposition to a predetermined thickness, according to the well known patterning processes.

The jumper substrate 23 is formed of a multiple-layer printed circuit board similarly to the package substrate 22. Thus, the jumper substrate 23 is formed of stacking of a plurality of glass-epoxy substrates each carrying thereon a conductor pattern. The jumper substrate 23 is disposed on the package substrate 22 so as to extend generally parallel with the upper major surface 25 of the package substrate 22 with a separation therefrom. Further, the jumper substrate 23 is formed of an opening 36 in correspondence to a central part thereof for accommodating the semiconductor chip 21. Thus, the semiconductor chip 21 is located inside the opening 36 of the jumper substrate 23 when the jumper substrate 23 is mounted upon the package substrate 22.

The opening 36 is filled with a resin 32 that encapsulates the semiconductor chip 21. As the opening 36 acts as a resin dam that prevents the resin to flow out, there is no need to provide additional resin dam structure. Thereby, the construction of the semiconductor device 20 is substantially simplified.

It should be noted that the jumper substrate has a lower major surface 31 facing the upper major surface 25 of the package substrate 22, wherein there are provided first contact electrodes 34 for contacting with the electrodes pattern 26 on the package substrate 23 as well as second contact electrodes 35 for contacting with the electrodes 33 provided on the upper major surface 25 of the package substrate 22 in correspondence to the through-holes 30. The contact electrodes 34 are thereby connected to the corresponding electrodes pattern 26 via solder bumps 37. Similarly, the contact electrodes 35 are connected to the electrodes 33 via solder bumps 38.

The first and second contact electrodes 34 and 35 are connected with each other via jumper interconnection paths 39, wherein the jumper interconnection paths 39 include through-holes 40 provided on the jumper substrate 23 and first and second printed conductor patterns 41 and 42, wherein the second printed conductor pattern 42 can be seen in FIG.7. The through-holes 40 have a construction substantially identical with the construction of the through-holes 30 provided on the package substrate 22 and includes a conductive coating 40a provided on the inner wall of the through-holes penetrating through the jumper substrate 23. On the other hand, the printed conductor patterns 41 and 42 are provided on the multiple-layer substrate forming the jumper substrate 23 in the form of a conductor pattern. In the illustrated example, the jumper substrate 23 includes two substrate layers stacked with each other, wherein the first substrate layer carries the printed conductor pattern 41 on the upper major surface thereof and the second substrate layer carries the printed conductor pattern 42. As the first and second substrate layers are stacked with each other, the jumper substrate 23 has a construction in which the second printed conductor pattern 42 is embedded inside the jumper substrate 23.

As already noted, the contact electrodes 34 and 35 are formed at the lower ends of the through-holes 40, while the first printed conductor patterns 41 connect the upper ends of the through-holes 40 with each other. Further, the second printed conductor patterns 42 connect the intermediate points of the through holes 40 with each other. Thereby, electrical connection is established between the first contact electrodes 34 and the second contact electrodes 35 by the jumper interconnection paths 39.

Hereinafter, the interconnection between the electrode pad 24 on the semiconductor chip 21 and the solder bump 29 provided on the lower major surface 22a of the package substrate 22 will be described.

In order to connect the electrode pads 24 on the semiconductor chip 21 to the corresponding solder bumps 29, it is necessary to provide an electrical interconnection that connects the electrode pattern 26 on the upper major surface 25 of the package substrate 22 and the solder bump 29 provided on the lower major surface 22a of the package substrate 22. In the conventional construction that lacks the jumper substrate 23, such an interconnection has been provided on the upper major surface 25 of the package substrate 22. In the present invention, on the other hand, one can achieve the desired interconnection by choosing one or more of three constructions below.

(1) Use of the jumper interconnection path 39 that includes the first printed conductor pattern 41.

(2) Use of the jumper interconnection path 39 that includes the second printed conductor pattern 42.

(3) Use of conventional interconnection pattern provided on the upper major surface 25 of the package substrate 22.

Hereinafter, each of the foregoing constructions (1)–(3) will be described with reference to FIGS. 5–8.

Referring to FIG. 5 showing the plan view of the semiconductor device 20 in an enlarged scale, it will be noted that the first printed conductor patterns 41 on the upper major surface of the jumper substrate 23 are represented by the continuous lines while the second printed conductor patterns 42 embedded in the jumper substrate 23 are represented by the one-dotted lines. Further, the broken lines represent the electrodes pattern 26 provided on the upper major surface 25 of the package substrate 22.

FIG. 6 shows the semiconductor device 20 in a cross sectional view taken along the line A—A defined in FIG.5, wherein the cross sectional view of FIG.6 shows an example of the construction (1) described above.

More specifically, the electrode pad 24 on the semiconductor chip 21 is connected to the corresponding electrode pattern 26 on the upper major surface 25 of the package substrate 22 via the solder bump 27, and the electrode pattern 26 is connected to the corresponding electrode 34 on the lower major surface 31 of the jumper substrate 23 via the solder bump 37. The electrode 34 is connected to an end of the conductor pattern 41 extending over the upper major surface of the jumper substrate 23 via the conductive coating 40a provided on the inner wall of the through-hole 40, while the other end of the conductor pattern 41 is connected to the conductive coating 40a provided on the inner wall of another through-hole 40, which in turn is connected to the electrode 35 on the lower major surface 31 of the jumper substrate 23. Further, the electrode 35 is connected to the corresponding electrode 33 on the upper major surface 25 of the package substrate 22 via the solder bump 38, and the electrode 33 is connected to the corresponding solder bump 29 on the lower major surface 22a of the package substrate 22 via the conductor pattern 30a on the inner wall of the through-hole 30 that extends through the package substrate 22.

In the interconnection structure of FIG. 6, it should be noted that one can provide an arbitrary interconnection pattern at the level below the conductor pattern 41. For example, one may shape the conductor pattern 42 as desired, irrespective of the pattern 41 on the upper major surface of the jumper substrate 23. Further, one may provide an arbitrary conductor pattern on the upper major surface 25 of the package substrate 22 by extending the electrode pattern 26 irrespective of the pattern 41. Thereby, the degree of freedom for designing the conductor patterns increases substantially.

FIG. 7 shows the cross sectional view of the semiconductor device 20 taken along the line B—B, wherein it should be noted that FIG. 7 shows an example of the foregoing construction (2).

Referring to FIG. 7, the electrode pad 24 on the semiconductor chip 21 establishes an electrical contact with the electrode pattern 26 on the package substrate 22 via the solder bump 27 similarly to the cross sectional structure shown in FIG. 6, and the electrode pattern 26 achieves an electrical connection with the electrode 34 on the lower major surface of the jumper substrate 23 by way of the solder bump 37.

In the cross sectional structure of FIG. 7, it should be noted that the conductive coating 40a provided on the inner wall of the contact hole 40 is connected to the conductor pattern 42 embedded in the jumper substrate 23, while the conductor pattern 42 is connected to the electrode 35 on the lower major surface of the jumper substrate 23 via the conductive coating 40a provided on another through-hole 40. Further, the electrode 35 is connected to the corresponding electrode 33 on the upper major surface 25 of the package substrate 22 via the solder bump 38, while the electrode 33 is connected to the corresponding electrode 28 on the lower major surface of the package substrate 22 via the conductive coating on the corresponding through-hole 30. The electrode 28 carries a solder bump 29 thereon.

In such a connection structure, one can provide arbitrary conductor patterns above and below the conductor pattern 42. More specifically, one may provide an arbitrary conductor pattern on the upper major surface of the jumper substrate 23 in correspondence to the conductor pattern 41, irrespective of the conductor pattern 42. Similarly, one may provide an arbitrary conductor pattern on the upper major surface of the package substrate 22 in correspondence to the electrode pattern 26, irrespective of the conductor pattern 42.

FIG. 8 shows the semiconductor device 20 in a cross sectional view taken along the line C—C shown in FIG. 5, wherein the cross sectional view of FIG. 8 corresponds to the foregoing structure (3).

Referring to FIG. 8, it will be noted that the electrode pad 24 on the semiconductor chip 21 is connected to the electrode pattern 26 on the upper major surface 25 of the package substrate 22, while the electrode pattern 26 extends over the upper major surface 25 and reaches the electrode 33 provided on one of the through holes 30. The through hole 30 carries a conductive coating on the inner surface thereof such that the electrode 33 on the upper major surface 25 is electrically connected to the corresponding electrode 28 on the lower major surface of the package substrate 22. Similarly as before, the electrode 28 carries thereon the solder bump 29.

In the structure of FIG. 8, it should be noted that one can provide arbitrary conductor patterns on the jumper substrate 23 irrespective of the electrode pattern 26. Thereby, it is possible to conduct the design of the conductor patterns 41 and 42 forming the jumper interconnection path 39 of FIG. 4, arbitrarily on the jumper substrate 23 and independently from the electrode pattern 26 on the package substrate 22.

Thus, the present invention substantially increases the degree of freedom for designing conductor patterns in semiconductor packages by using one or more of the foregoing structures (1)–(3). In other words, the present invention increases the degree of freedom for designing the conductor patterns in the package by providing the possibility of forming conductor patterns on the jumper substrate in addition to the package substrate. Associated with the advantageous feature of increased degree of freedom of designing the conductor patterns, the present invention provides an additional advantage that the density of the conductor patterns on the package substrate 22 can be reduced, while such a reduction in the density of the conductor patterns on the package substrate 22 enables a reduction in size of the package substrate 22 and hence the semiconductor device 20 itself.

In relation to the reduced size of the semiconductor device 20, it should be noted that the jumper substrate 23 of the present embodiment is provided on the free space on the package substrate 22 which is not occupied by the semiconductor chip 21. As a result, the use of the jumper substrate 23 does not result in any increase in the lateral as well as vertical sizes of the semiconductor device 20. It should be noted that the jumper substrate 23 is held on the upper major surface 25 of the package substrate 22 without lateral protrusion, and there occurs no increase in the lateral size of the semiconductor device 20. Further, by setting the thickness of the jumper substrate 23 to be substantially small, in the order comparable to the thickness of the semiconductor chip 21, no substantial increase occurs in the overall height of the semiconductor device 20.

As the jumper substrate 23 forms a separate body with respect to the package substrate 22, one can provide the conductor patterns 41 and 42 on the jumper substrate 23 independently to the electrode pattern 26 on the package substrate 22 as already noted. In other words, the conductor patterns 41 or 42 may extend across the electrode patterns 26 on the package substrate 22. Thereby, any of the electrode pads 24 on the semiconductor chip 21 can be connected to any of the electrodes 33 on the package substrate 22 by way of the jumper substrate 23. Further, as a result of reduced density for the conductor patterns on the package substrate 22 as well as on the jumper substrate 23, the spatial separation between the conductor patterns increases and the problem of electromagnetic interference or crosstalk of the signals on the conductor patterns is substantially reduced. Thereby, the reliability of the semiconductor device increases.

Figure 9:
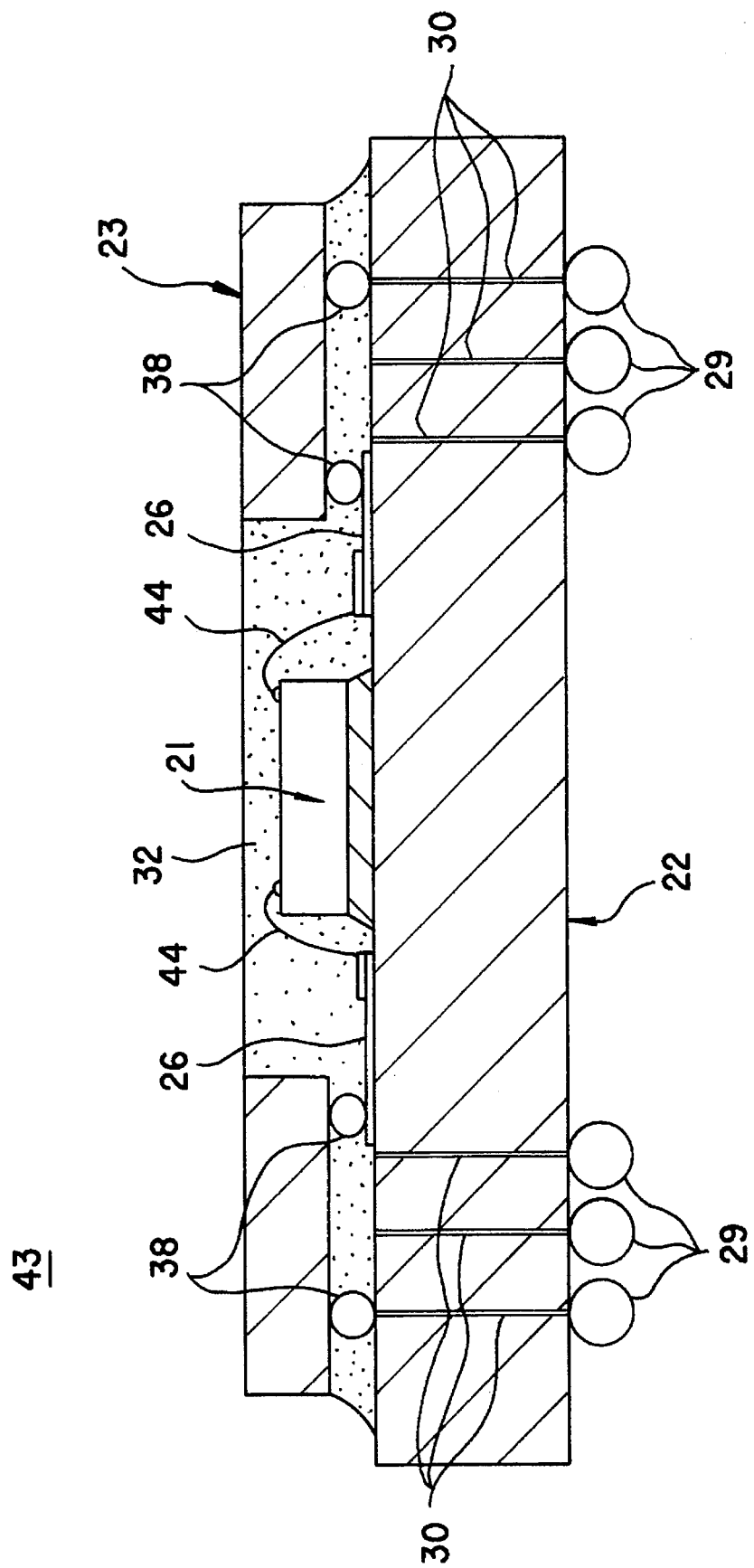
FIG.9 is a diagram showing the construction of a semiconductor device according to a second embodiment of the present invention.

Next, a semiconductor device 43 according to a second embodiment of the present invention will be described with reference to FIG. 9. In FIG. 9, those parts described previously are designated by the corresponding reference numerals and the description thereof will be omitted.

Referring to FIG. 9, the semiconductor device 43 employs bonding wires 44 for the interconnection between the semiconductor chip 21 and the electrode patterns 26 on the package substrate 22. In this case, too, the construction of the present invention to employ the jumper substrate 23 for connecting the semiconductor chip 21 to the package substrate 22 is effective, similarly to the case of the first embodiment in which the flip-chip process is employed for mounting the semiconductor chip 21 upon the package substrate 22.

Figure 10:
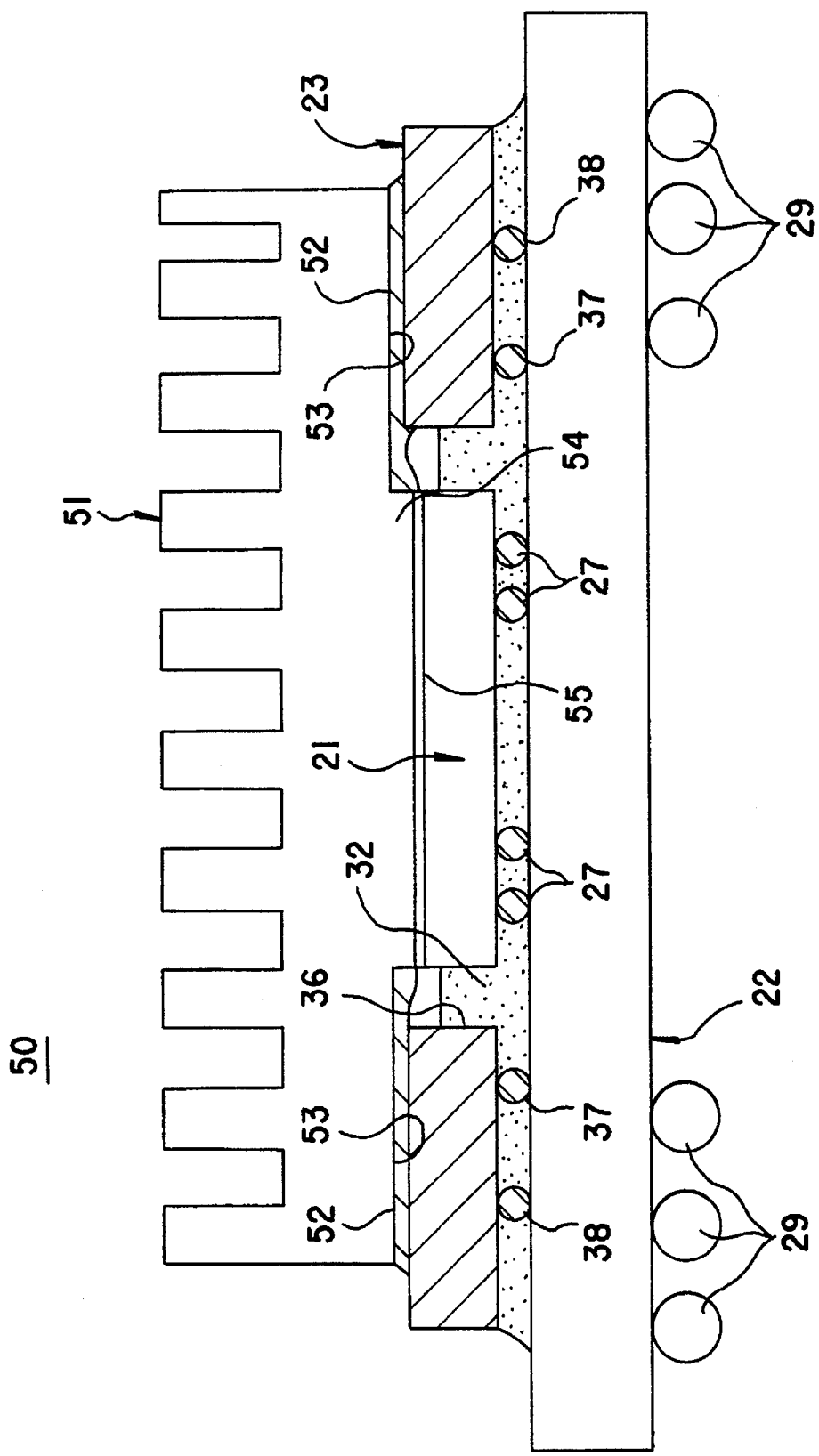
FIG.10 is a diagram showing the construction of a semiconductor device according to a third embodiment of the present invention.

Next, a semiconductor device 50 according to a third embodiment of the present invention will be described with reference to FIG. 10. In FIG. 10, those parts described previously with reference to preceding embodiments are designated by the same corresponding reference numerals and the description thereof will be omitted.

Referring to FIG. 10, the semiconductor device 50 has a structure substantially identical to that of the semiconductor device 20 except that the semiconductor device 50 includes a heat sink structure 51. Typically, the heat sink 51 is formed of a material having an excellent thermal conductivity such as aluminum and includes a number of heat radiation fins for efficient heat dissipation. Generally, the heat sink 51 occupies a substantial part of the semiconductor device 50 in terms of both the size and weight. In order to achieve an efficient heat dissipation from the semiconductor chip 21, it is desired to contact the heat sink 51 with the semiconductor chip 21 directly.

On the other hand, such a construction to contact the heavy and large heat sink 51 directly on the semiconductor chip 21 raises various problems such as the stressing of the semiconductor chip 21 including the effect of thermal stress due to the large difference in thermal expansion between the semiconductor chip 21 and the heat sink 51, or damaging of the solder bumps 27.

In order to avoid such problems, the semiconductor device 50 of the present embodiment is constructed such that the heat sink 51 is carried on the upper major surface of the jumper substrate 23 rather than on the semiconductor chip 21. More specifically, the heat sink 51 is formed to have a projecting region 54 on the central part of the lower major surface of the heat sink 51 in conformity with the size and shape of the upper major surface of the semiconductor chip 21 such that the central part 54 is defined by a stepped boundary with respect to the marginal part designated by a numeral 53. The heat sink 51 is mounted upon the upper major surface of the jumper substrate 23 by way of an adhesive layer 52 such that the lower major surface of the heat sink 51 is supported, in correspondence to the marginal part thereof, by the upper major surface of the jumper substrate 23 except for the projecting central part 54. As indicated in FIG. 10, the central part 54 of the heat sink 51 extends toward the semiconductor chip 21 and faces the upper major surface of the semiconductor chip 21. Thereby, the gap between the projecting central part 54 and the upper major surface of the semiconductor chip 21 is filled by a layer 55 of thermally conductive resin. As the projecting central part 54 of the heat sink 51 does not engage directly with the semiconductor chip 21, the semiconductor chip 21 is free from any load caused by the heat sink 51.

In the semiconductor device 50 of the present embodiment where the heat sink 51 is supported by the jumper substrate 23 rather than the semiconductor chip 21 itself, it is possible to use a large heat sink for better efficiency of heat dissipation. As the heat sink 51 is separated from the semiconductor chip 21 by the layer 55 of thermally conductive resin, the problem of buildup of thermal stress upon the semiconductor chip 21 due to the difference in the thermal expansion between the semiconductor chip 21 and the heat sink 51 does not occur. Because of the high efficiency of heat conduction of the resin layer 55, the dissipation of heat from the semiconductor chip 21 can be achieved efficiently.

As already noted, the semiconductor device 50 of the present invention can employ a large heat sink structure for the heat sink 51 by bearing the load by the jumper substrate 23. It should be noted that the jumper substrate 23 is formed of a stacking of glass-epoxy substrates and has a sufficient strength for bearing the load of the heat sink structure provided thereon. Further, it should be noted that the solder bumps 37 and 38 are provided with a large number between the package substrate 22 and the jumper substrate 23, and the load applied to each of the solder bumps is successfully reduced.

Next, the fabrication process of the semiconductor device of the present invention will be described with reference to FIGS. 11A–11D showing the fabrication process of the semiconductor device 50 of FIG. 10 that uses the so-called flip-chip process.

Figure 11A:
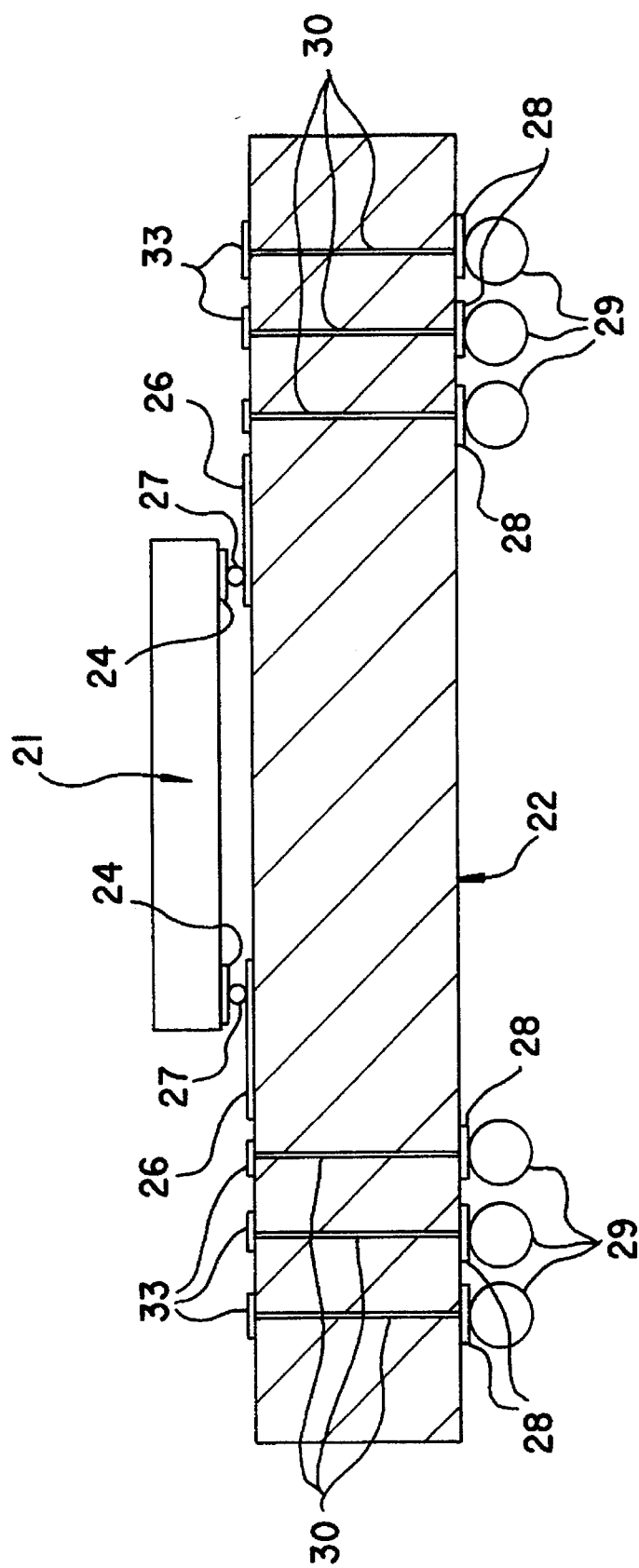

Referring to FIG. 11A, the package substrate 22 is prepared at first such that the package substrate 22 carries the electrode patterns 26 on the upper major surface thereof and the electrodes 28 on the lower major surface thereof in correspondence to the through-holes 30, together with the solder bumps 29 provided on the electrodes 28. After the package substrate 22 is thus formed, the semiconductor chip 21 is placed upon the package substrate 22 such that the solder bumps 27 on the electrode pads 24 of the semiconductor chip 21 are contacted to the corresponding electrode patterns 26 on the package substrate 22.

After the semiconductor chip 21 is thus placed upon the package substrate 22, the jumper substrate 23 is placed further upon the package substrate 22 such that the semiconductor chip 21 on the package substrate 22 is accommodated into the opening 36 provided on the jumper substrate 23 as indicated in FIG. 11B. It should be noted that the jumper substrate 23 is already provided with the electrodes 34 and 35 on the lower major surface thereof in correspondence to the through-holes 40 and carries the conductor patterns 41 and 42. Thus, when placing the jumper substrate 23 upon the package substrate 22 such that the semiconductor chip 21 is accommodated into the opening 36 as already mentioned, the solder bumps 37 and 38 provided in correspondence to the electrodes 34 and 35 establish engagement with the corresponding electrode patterns 26 and the electrodes 33 on the upper major surface of the package substrate 22.

After the semiconductor chip 21 and the jumper substrate 23 are thus placed upon the package substrate 22, the package substrate 22 is incorporated into a furnace held at a temperature of 240° C. for causing a reflow of the solder bumps 27, 37 and 38. Thereby, the semiconductor chip 21 and the jumper substrate 23 are firmly mounted upon the package substrate 22 together with proper electrical connections.

Figure 11C:
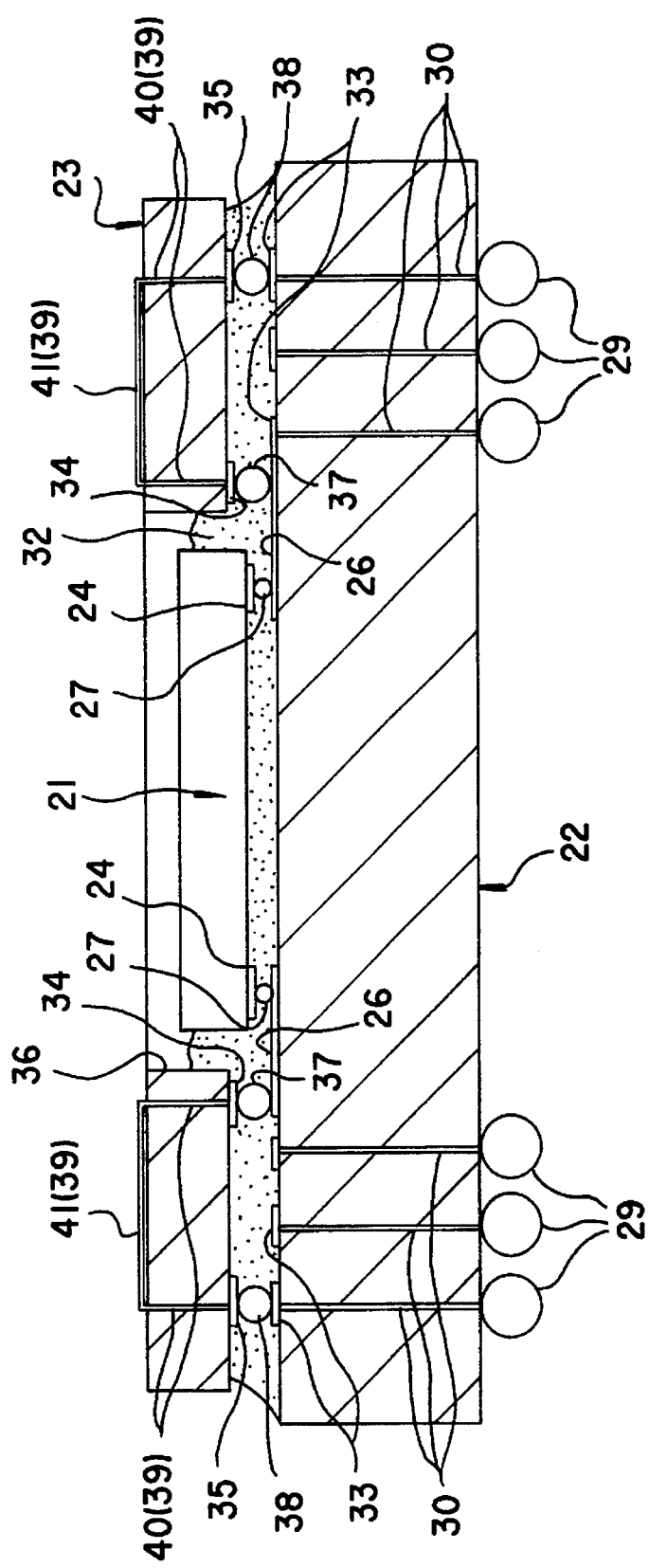

After the process of reflowing, the resin 32 is filled upon the opening 36 of the jumper substrate 23 as indicated in FIG. 11C. Thereby, the opening 36 of the jumper substrate 23 acts as a resin dam that controls the flow of resin, and the problem of the resin 32 flowing away from the upper major surface of the package substrate 22 is effectively eliminated. When filling the resin 32, it is preferred to control the amount of the resin such that the upper major surface of the semiconductor chip 21 is exposed.

After the step of FIG. 11C, a thermally conductive resin is applied upon the exposed upper major surface of the semiconductor chip 21 to form the resin layer 55. Further, a thermosetting adhesive is applied upon the upper major surface of the jumper substrate 23 to form the adhesive layer 52, and the heat sink 51 described before is mounted upon the jumper substrate 23, such that the marginal region 53 of the lower major surface of the heat sink 51 is mounted on the upper major surface of the package substrate 23 via the adhesive layer 52 as indicated in FIG. 11D. In the state of FIG. 11D, the central, projecting part 54 of the heat sink 51 extends downward from the level of the upper major surface of the package substrate 23 and faces the upper major surface of the semiconductor chip 21. Thereby, the projecting part 54 establishes an intimate contact with the adhesive layer 52. Further, by applying a heat treatment process at a temperature such as 150° C., the adhesive layer 52 is cured and the device shown in FIG. 10 is obtained.

In the foregoing embodiments, it should be noted that one may employ various substrates such as a ceramic substrate for the package substrate 22 and the jumper substrate 23 in place of the glass-epoxy substrate.

Further, one may reverse the steps for placing the semiconductor chip 21 on the package substrate 22 and the jumper substrate 23 on the package substrate 22 such that the jumper substrate 23 is placed upon the package substrate 22 prior to the step of placing the semiconductor chip 21 upon the package substrate 22.

In the description heretofore, it should be noted that one may use other components such as a phase filter or SAW filter used in various information processing apparatuses for band pass filters and the like, in place of the semiconductor chip. In other words, the present invention can also be applicable to a package structure that holds an electronic component in place of the semiconductor chip.

Further, the present invention is not limited to the embodiments described heretofore, but various variations and modifications may be made without departing from the scope of the invention.

What is claimed is:

1. A semiconductor device, comprising:

a semiconductor chip carrying thereon electrode pads;

a package substrate having upper and lower major surfaces for supporting said semiconductor chip on said upper major surface;

first group electrodes provided on said upper major surface of said package substrate in a first area in electrical connection to said electrode pads on said semiconductor chip;

second group electrodes provided on said upper major surface of said package substrate in a second area different from said first area;

third group electrodes provided on said lower major surface of said package substrate for external connection;

through-holes provided on said package substrate so as to extend therethrough from said upper major surface to said lower major surface of said package substrate, each of said through-holes connecting one of said second group electrodes to a corresponding one of said third group electrodes and including a conductive member for connecting said first group electrode to said second group electrode electrically;

a jumper substrate having upper and lower major surfaces and disposed on said upper major surface of said package substrate such that said lower major surface of said jumper substrate faces said upper major surface of said package substrate, said jumper substrate carrying first contacts on said lower major surface in electrical connection with said first group electrodes on said upper major surface of said package substrate, second contacts also on said lower major surface in electrical connection with said second group electrodes on said upper major surface of said package substrate, and an interconnection pattern connecting each of said first contacts on said jumper substrate to corresponding one of said second contacts on said jumper substrate;

said jumper substrate having an opening extending from said upper major surface to said lower major surface of said jumper substrate for accommodating said semiconductor chip therein; and a resin body provided on said upper major surface of said package substrate for encapsulating said semiconductor chip together with said jumper substrate on said upper major surface of said package substrate.

2. A semiconductor device as claimed in claim 1, wherein said jumper substrate carries a heat sink member on said upper major surface thereof, for radiating heat generated in said semiconductor chip.

3. A semiconductor device as claimed in claim 2, wherein a thermally conductive resin is interposed between said semiconductor chip and said heat sink member.

4. A semiconductor device as claimed in claim 1, wherein said semiconductor chip is mounted upon said package substrate in a state that each of said electrode pads on said semiconductor chip establishes a contact engagement with corresponding one of said first group electrodes.

5. A semiconductor device as claimed in claim 1, wherein each of said electrode pads on said semiconductor chip is connected to corresponding one of said first group electrodes by a bonding wire.

6. A semiconductor device as claimed in claim 1, wherein said jumper substrate comprises a multiple layer printed circuit board that includes a plurality of substrate layers and corresponding plurality of conductor patterns.

7. A package structure, comprising:

a component carrying thereon electrode pads;

a package substrate having upper and lower major surfaces for supporting said component on said upper major surface;

first group electrodes provided on said upper major surface of said package substrate in a first area in electrical connection to said electrode pads on said component;

second group electrodes provided on said upper major surface of said package substrate in a second area different from said first area;

third group electrodes provided on said lower major surface of said package substrate for external connection;

through-holes provided on said package substrate so as to extend therethrough from said upper major surface to said lower major surface of said package substrate, each of said through-holes connecting one of said second group electrodes to a corresponding one of said third group electrodes and including a conductive member for connecting said first group electrode to said second group electrode electrically;

a jumper substrate having upper and lower major surfaces and disposed on said upper major surface of said package substrate such that said lower major surface of said jumper substrate faces said upper major surface of said package substrate, said jumper substrate carrying first contacts on said lower major surface in electrical connection with said first group electrodes on said upper major surface of said package substrate, second contacts also on said lower major surface in electrical connection with said second group electrodes on said upper major surface of said package substrate, and an interconnection pattern connecting each of said first contacts on said jumper substrate to corresponding one of said second contacts on said jumper substrate;

said jumper substrate having an opening extending from said upper major surface to said lower major surface of said jumper substrate for accommodating said component; and a resin body provided on said upper major surface of said package substrate for encapsulating said component together with said jumper substrate on said upper major surface of said package substrate.

8. A package structure as claimed in claim 7, wherein said jumper substrate carries a heat sink member on said upper major surface thereof, for radiating heat generated in said component.

9. A package structure as claimed in claim 8, wherein a thermally conductive resin is interposed between said component and said heat sink member.

10. A package structure as claimed in claim 7, wherein said component is mounted upon said package substrate in a state that each of said electrode pads on said component establishes a contact engagement with corresponding one of said first group electrodes.

11. A package structure as claimed in claim 7, wherein each of said electrode pads on said component is connected to corresponding one of said first group electrodes by a bonding wire.

12. A package structure as claimed in claim 7, wherein said jumper substrate comprises a multiple layer printed circuit board that includes a plurality of substrate layers and corresponding plurality of conductor patterns.

* * * * *